United States Patent
Takahashi et al.

(10) Patent No.: US 8,107,241 B2
(45) Date of Patent: Jan. 31, 2012

(54) ELECTRIC POWER CONVERSION APPARATUS INCLUDING COOLING UNITS

(75) Inventors: Tetsuya Takahashi, Chiyoda-ku (JP); Kazuyoshi Toya, Chiyoda-ku (JP); Akihiro Murahashi, Chiyoda-ku (JP); Yasushi Nakayama, Chiyoda-ku (JP); Shigetoshi Ipposhi, Chiyoda-ku (JP); Kenichi Hayashi, Chiyoda-ku (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 91 days.

(21) Appl. No.: 12/293,132

(22) PCT Filed: Mar. 31, 2006

(86) PCT No.: PCT/JP2006/306812
§ 371 (c)(1),
(2), (4) Date: Sep. 16, 2008

(87) PCT Pub. No.: WO2007/116460
PCT Pub. Date: Oct. 18, 2007

(65) Prior Publication Data
US 2009/0080155 A1    Mar. 26, 2009

(51) Int. Cl.
*H05K 7/20*    (2006.01)
*F28F 7/00*    (2006.01)
*H01L 23/34*   (2006.01)
*H02P 27/04*   (2006.01)

(52) U.S. Cl. ........ 361/700; 361/696; 361/699; 361/701; 361/719; 165/104.33; 165/80.4; 165/80.5; 174/15.1; 257/715; 363/141; 318/801

(58) Field of Classification Search ................... 361/690, 361/694, 695, 696, 698, 699, 700, 701, 715, 361/719, 722; 165/104.33, 185, 80.2, 80.4–80.5; 174/15.1; 257/714–715; 363/141; 318/801
See application file for complete search history.

(56) References Cited

U.S. PATENT DOCUMENTS
5,930,112 A * 7/1999 Babinski et al. .............. 361/695
(Continued)

FOREIGN PATENT DOCUMENTS
EP    0 794 098 A1    9/1997
(Continued)

OTHER PUBLICATIONS
Form PCT/ISA/210 (International Search Report) dated Jun. 27, 2006.
(Continued)

*Primary Examiner* — Zachary M Pape
(74) *Attorney, Agent, or Firm* — Buchanan Ingersoll & Rooney PC

(57) ABSTRACT

In a conventional cooling device, a heat pipe or a circulation-type liquid cooler provided with a pump is used and therefore, a large space is needed for the cooling device. There is provided a cooling device which includes a plurality of cooling modules having cooling units for cooling heat-generating elements by coolant and radiation units for radiating heat from the coolant heated in the cooling units, the plurality of cooling modules being bubble-pump-type ones in which the coolant is circulated between the radiation units and the cooling units by the coolant being boiled in the cooling units, the radiation units being arranged side by side, and a cooling fan for generating wind blowing the radiation units.

18 Claims, 8 Drawing Sheets

U.S. PATENT DOCUMENTS

| | | | |
|---|---|---|---|
| 6,076,596 A * | 6/2000 | Osakabe et al. | 165/104.33 |
| 6,102,110 A * | 8/2000 | Julien et al. | 165/104.33 |
| 6,719,040 B2 * | 4/2004 | Sugito et al. | 165/104.21 |
| 6,822,866 B2 * | 11/2004 | Fearing et al. | 361/701 |
| 2003/0168267 A1 * | 9/2003 | Borroni-Bird et al. | 180/68.1 |
| 2004/0012983 A1 * | 1/2004 | Fearing et al. | 363/16 |
| 2005/0155744 A1 * | 7/2005 | Ippoushi et al. | 165/104.11 |
| 2006/0171115 A1 * | 8/2006 | Cramer | 361/695 |
| 2009/0065182 A1 * | 3/2009 | Takahashi et al. | 165/104.33 |

FOREIGN PATENT DOCUMENTS

| | | |
|---|---|---|
| GB | 2 225 099 A | 5/1990 |
| JP | 49-103244 A | 9/1974 |
| JP | 53-146167 A | 12/1978 |
| JP | 57-147258 | 9/1982 |
| JP | 58-066571 A | 4/1983 |
| JP | 2-122554 A | 5/1990 |
| JP | 3-011924 A | 1/1991 |
| JP | 5-283571 A | 10/1993 |
| JP | 07-251737 | 10/1995 |
| JP | 09-118225 | 5/1997 |
| JP | 9-219904 A | 8/1997 |
| JP | 9-246767 A | 9/1997 |
| JP | 2000-232191 A | 8/2000 |
| JP | 2002-134670 A | 5/2002 |
| JP | 2005-195226 A | 7/2005 |

OTHER PUBLICATIONS

English translation of Notice of Reason for Rejection in corresponding Japanese Patent Application No. 2008-509612, dated Sep. 24, 2008, 4 pages.

Notice of Reason for Rejection dated Sep. 21, 2010 in corresponding Japanese Patent Application No. 2009-061201 and English language translation, 9 pages.

Office Action dated Dec. 14, 2010 in a corresponding CN application and English-language translation, 4 pages.

Office Action dated Feb. 25, 2011, in a corresponding KR application and English-language translation, 8 pages.

* cited by examiner (a)

(b)

ELECTRIC POWER CONVERSION APPARATUS INCLUDING COOLING UNITS

TECHNICAL FIELD

The present invention relates to electric power conversion apparatuses provided with semiconductor devices that perform a switching operation for electric power conversion, and cooling units for cooling the semiconductor devices.

BACKGROUND ART

An electric power conversion apparatus such as a converter or an inverter is used as an electric power source for an electric motor in general industrial fields. In the electric power conversion apparatus such as the converter or the inverter, electric power conversion is performed by supplying/interrupting electric power using a semiconductor device such as an IGBT (insulated gate bipolar transistor), a thyristor, a transistor, or a diode. Because power loss in the semiconductor device results in heat generation, when the semiconductor device reaches a higher temperature due to heat generated with power loss, its normal operation cannot be maintained, or its conversion efficiency is decreased. It is important for the electric power conversion apparatus that the semiconductor device is cooled to be within a predetermined temperature range. Here, in some cases, an IPM (intelligent power module) is also used in which the semiconductor device is modularized integrally including its driving circuit.

In a conventional electric power conversion apparatus, a system has been practically used in which the semiconductor device is cooled using a heat pipe. The heat pipe has a structure in which coolant is sealed in a tube stood in the vertical orientation; a target to be cooled is contacted with a lower portion of the tube; and a fin or like heat-dissipative structure is provided in its upper portion. The coolant sealed in the tube is vaporized in the lower portion by the heat received from the target to be cooled. The vaporized coolant moves toward the upper portion of the tube, and then returns to the liquid state with losing its heat at the upper portion of the tube, and thereafter the liquid-state coolant, after flowing along the inside wall of the tube, is accumulated at the lower portion. The accumulated coolant is again vaporized. As described above, in the heat pipe, by vaporizing the coolant, the heat is transferred from the lower to the upper portion, and is then dissipated from the upper portion to the outside, whereby the target to be cooled that is contacted with the lower portion is cooled.

In an electric power conversion apparatus using a heat pipe, a circuit board on which a semiconductor device that generates heat is mounted is horizontally arranged so that the semiconductor device faces downward, whereby the heat pipe is placed to contact with the upward-facing bottom face of the circuit board (for example, refer to Patent Document 1).

An electric power conversion apparatus for an electric rolling stock has also been practically used, which includes a heat-receiving plate having a flow channel for flowing cooling liquid therethrough, to which a semiconductor device is attached, a heat exchanger for exchanging heat between the cooling liquid from the heat-receiving plate and the air, a pump for circulating the cooling liquid between the heat-receiving plate and the heat exchanger, and a blowing means for blowing cooling wind to the heat exchanger, and in which plural sets of the heat-receiving plates, the heat exchangers, the pumps, and the blowing means are collinearly arranged perpendicularly to the longitudinal orientation of the car body. The blowing means and the heat-receiving plate face approximately in parallel with each other, while the heat exchanger and the heat-receiving plate are positioned perpendicularly to each other (for example, refer to Patent Document 2).

[Patent Document 1]
Japanese Laid-Open Patent Publication No. 2002-134670
[Patent Document 2]
Japanese Laid-Open Patent Publication No. 1997-246767

DISCLOSURE OF THE INVENTION

Problems to be Solved by the Invention

In the electric power conversion apparatus in which cooling is performed using the heat pipe, the heat pipe is needed to be vertically arranged, and the circuit board is needed to be horizontally arranged, and thus a height equals to or more than approximately 10 cm is needed for the heat pipe; therefore, it has been difficult that the circuit boards are arranged in overlapping relation. The amount of heat generation of the semiconductor device and the area needed for mounting the semiconductor device are determined corresponding to the conversion ability of the electric power conversion apparatus, and thus the height and the volume of the heat pipe are determined by the heat generation amount per unit area; therefore, a predetermined volume has also been needed for the cooling unit to meet the circuit board having a predetermined amount of heat generation.

In the electric power conversion apparatus with the cooling method in which the cooling liquid is circulated using the pump, a space has been needed for an attachment such as the pump and a reserve tank for the cooling liquid. Moreover, the heat exchanger and the heat-receiving plate are placed perpendicularly to each other, and a predetermined area is needed for the heat exchanger; therefore, a set of the heat-receiving plate, the heat exchanger, the pump, and the blowing means could not have been arranged with a particularly small gap.

An objective of the present invention is to obtain an electric power conversion apparatus whose volume needed to realize a predetermined conversion-ability level is smaller than that of the conventional one.

Means for Solving the Problem

An electric power conversion apparatus according to the present invention includes semiconductor devices each performing a switching operation for electric power conversion, a plurality of cooling units having their respective device coolers for cooling the semiconductor devices by coolant and radiators for radiating heat from the coolant heated in the device coolers, as bubble-pump-type ones in which the coolant is circulated between the radiators and the device coolers by the coolant being boiled in the device coolers, the radiators being arranged side by side, and a cooling fan for generating wind blowing the radiator.

Advantageous Effect of the Invention

The electric power conversion apparatus according to the present invention includes the semiconductor devices each performing the switching operation for electric power conversion, the plurality of cooling units having the device coolers for cooling the semiconductor devices by the coolant and the radiators for radiating heat from the coolant heated in the device coolers, as the bubble-pump-type ones in which the coolant is circulated between the radiators and the device coolers by the coolant being boiled in the device coolers, the radiators being arranged side by side, and the cooling fan for generating wind blowing the radiator; therefore, an effect is obtained that the volume, needed to realize a predetermined conversion-ability level, of the apparatus is smaller than that of the conventional one.

EXPLANATION OF REFERENCES

100: Electric power conversion apparatus
1: Main circuit unit
1A: Case (Fixing member)
1B: Aperture
1C: Filter
2: Blower (Cooling fan)
3: Electrical component (Electrical part)
4: Duct (Wind tunnel)
5: Capacitor
6: Cooling module (Cooling unit)
6A: Device cooler
6B: Heat exchanger
6C: Radiator
6D: Heat-receiving tube
6E: Pipe
6F: Partition
6G: Pipe
6H: Pipe
6J: Pipe
6K: Heat radiation pipe
6L: Heat radiation fin
7: Semiconductor device
8: Wiring board (Connection board)
9: Unit-main-circuit wiring board (Connection board)
10: Capacitor-main-circuit wiring board (Connection board)
10A: Connecting portion
200: Structural member

BEST MODE FOR CARRYING OUT THE INVENTION

Embodiment 1

Figure 1:
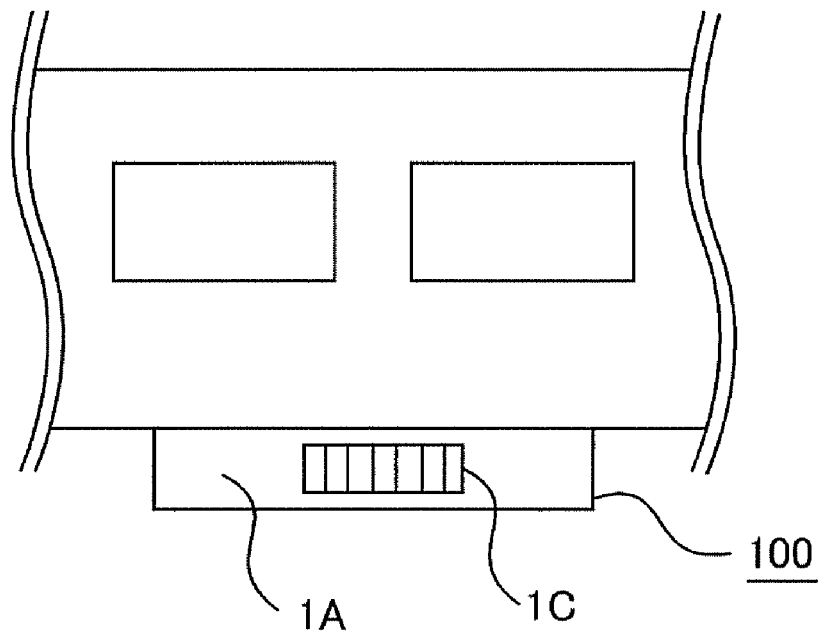
FIG. 1 is views of a state in which an electric power conversion apparatus according to Embodiment 1 of the present invention is attached to an electric car.
Figure 1:
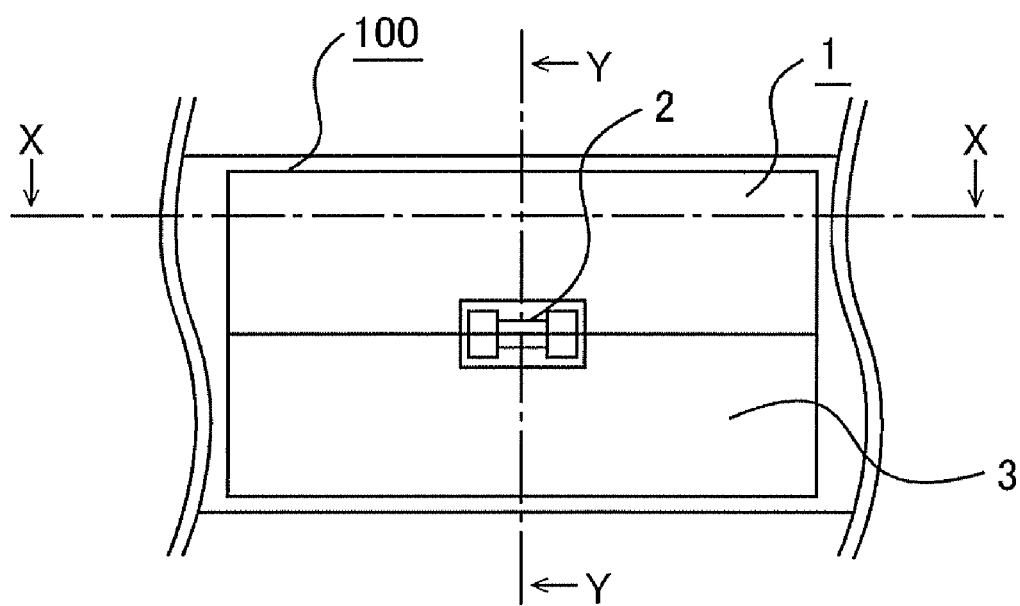
Figure 2:
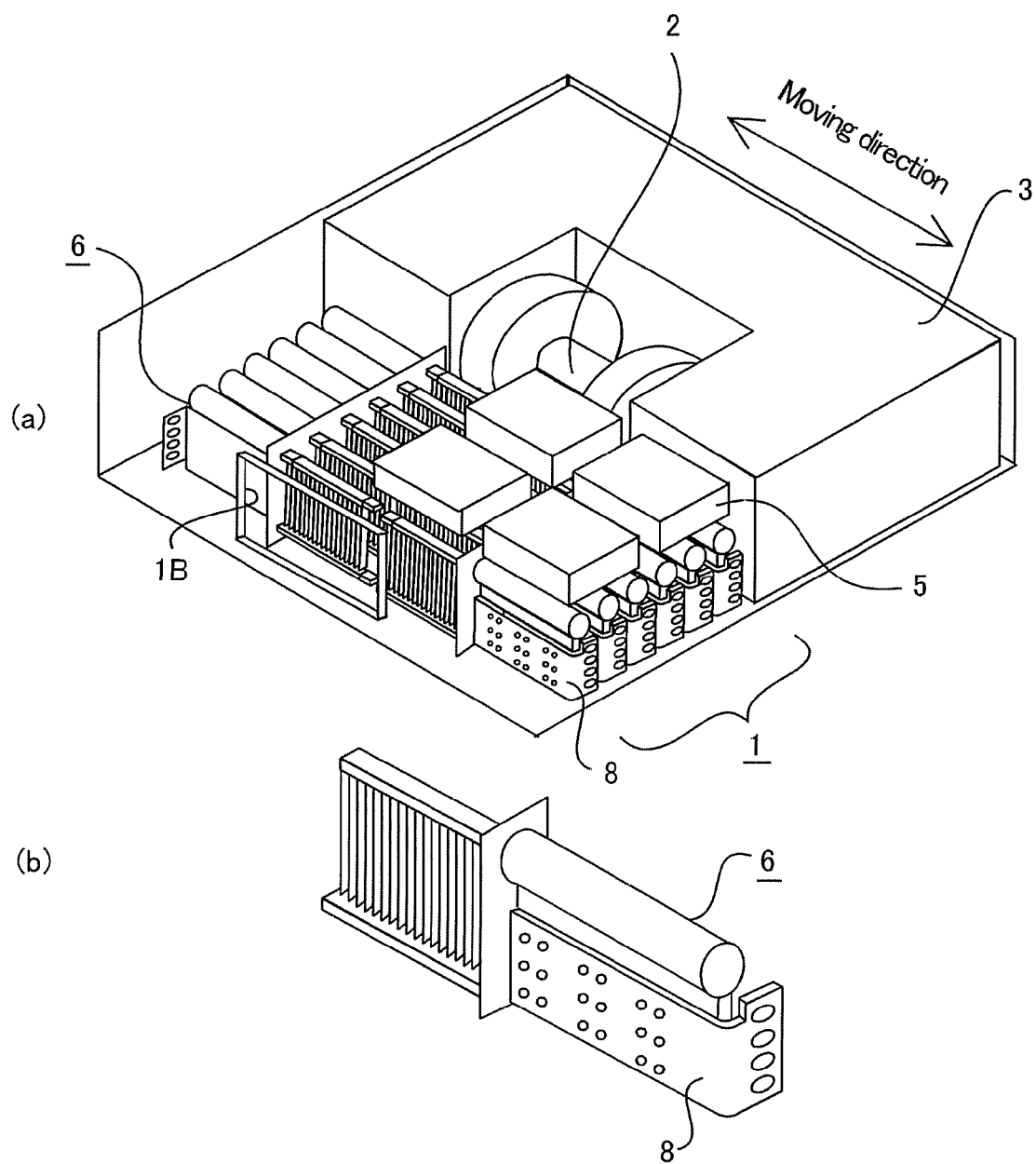
FIG. 2 is perspective views explaining a configuration of the electric power conversion apparatus according to Embodiment 1 of the present invention.
Figure 3:
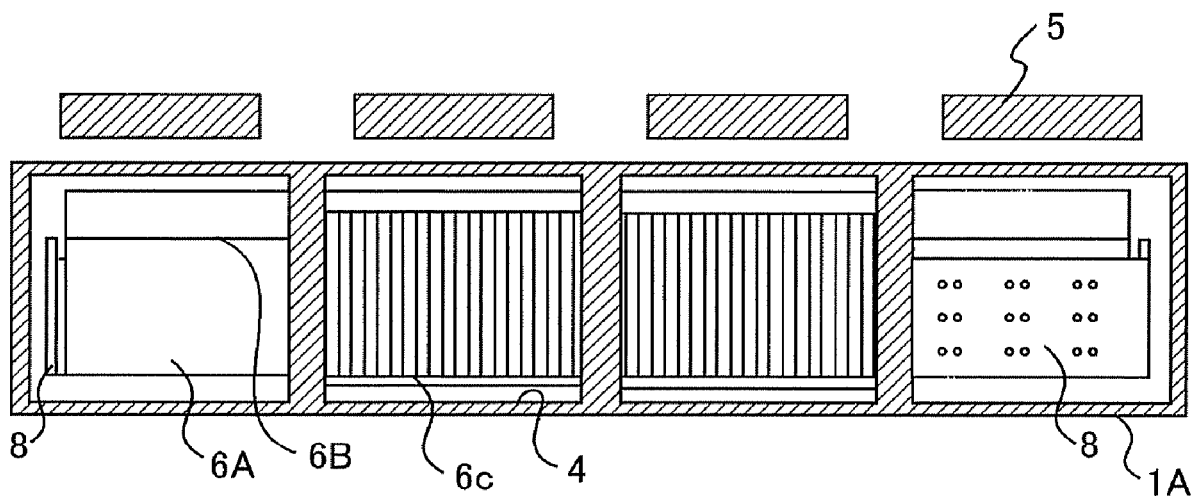
FIG. 3 is a cross-sectional view explaining the configuration of the electric power conversion apparatus according to Embodiment 1 of the present invention.
Figure 4:
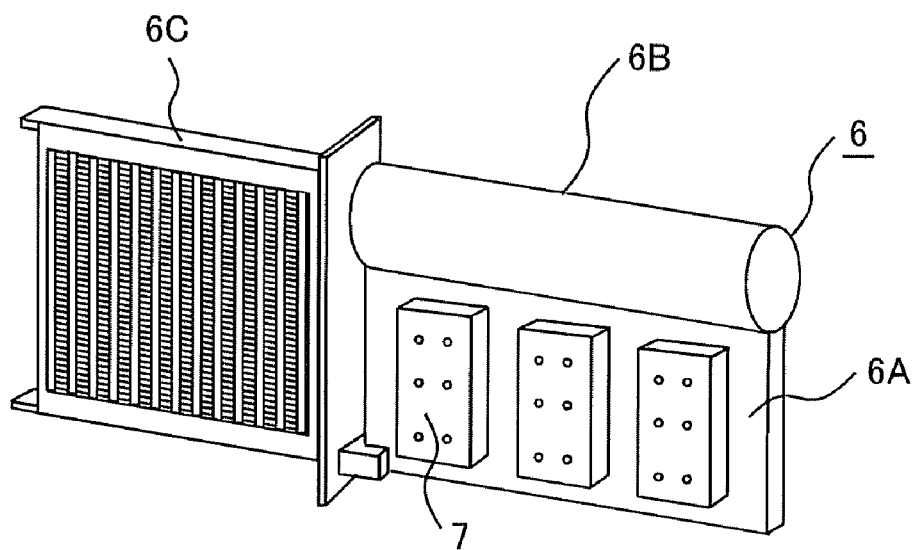
FIG. 4 is a perspective view illustrating a cooling module with semiconductor devices mounted thereon, for constituting the electric power conversion apparatus according to Embodiment 1 of the present invention.
Figure 5:
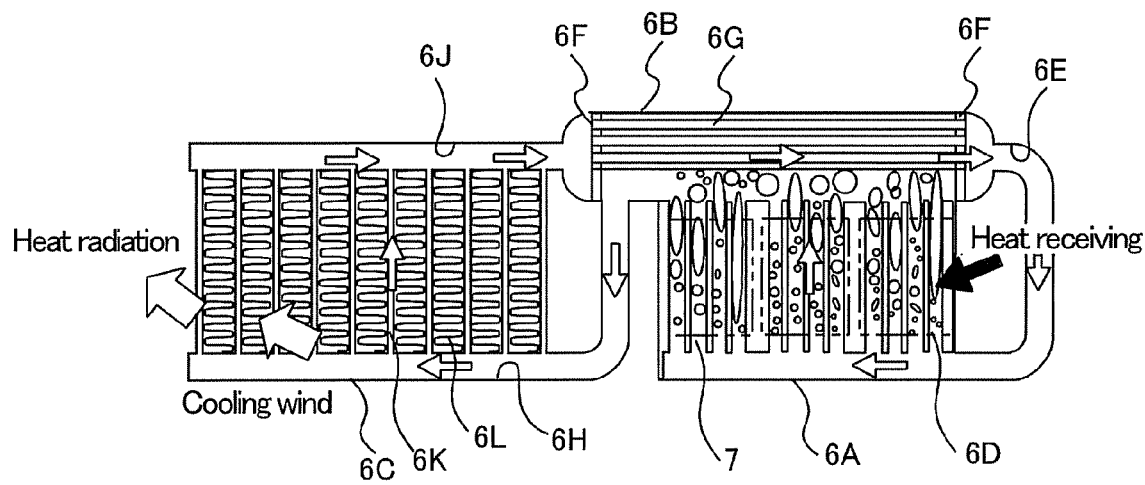
FIG. 5 is a view explaining a configuration of the cooling module used in the electric power conversion apparatus and the flow of coolant therethrough according to Embodiment 1 of the present invention.
Figure 6:
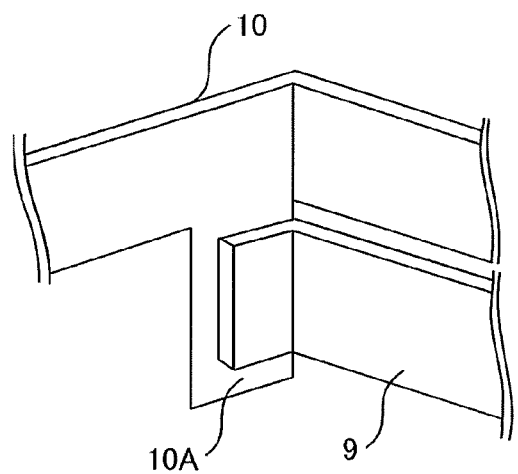
FIG. 6 is a perspective view explaining a wire connection method in the electric power conversion apparatus according to Embodiment 1 of the present invention.
Figure 7:
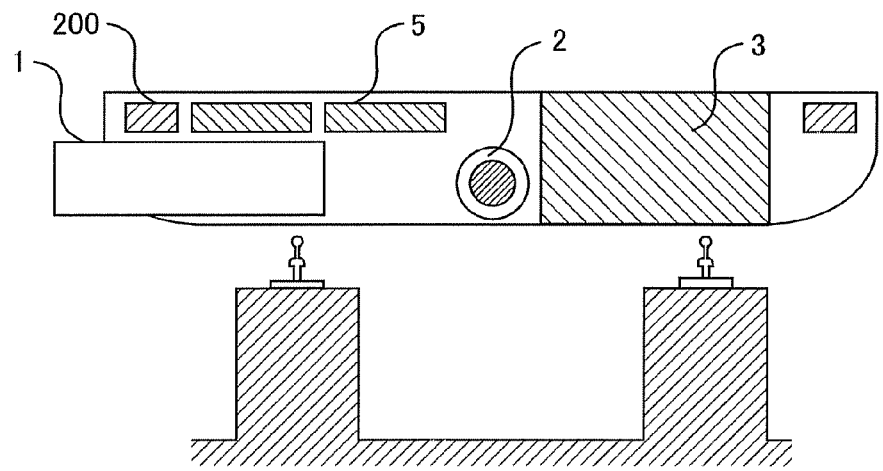
FIG. 7 is a view explaining a method of detaching from the electric car the electric power conversion apparatus according to Embodiment 1 of the present invention.

An electric power conversion apparatus having a converter and an inverter for an electric car according to Embodiment 1 of the present invention is explained using FIG. 1-FIG. 7. FIG. 1 is a view explaining a state in which the electric power conversion apparatus according to Embodiment 1 is attached to the electric car. Its side view is illustrated in FIG. 1(a), while its plan view viewed from its bottom is illustrated in FIG. 1(b). FIG. 2 is a perspective view explaining a configuration of the electric power conversion apparatus according to Embodiment 1. A perspective view of the entire configuration is illustrated in FIG. 2(a), and that of a single cooling module on which a predetermined number of semiconductor devices is mounted is illustrated in FIG. 2(b). A cross-sectional view of the X-X cross section according to FIG. 1(b) is illustrated in FIG. 3. FIG. 4 is a perspective view of the cooling module, on which the semiconductor devices are mounted, constituting the electric power conversion apparatus according to Embodiment 1 of the present invention. FIG. 5 is a view explaining a configuration of the cooling module and flowing of coolant used in the electric power conversion apparatus according to embodiment 1 of the present invention. FIG. 6 is a perspective view explaining a method of connecting wires so as to enable to constitute an electric circuit for the electric power conversion apparatus. FIG. 7 is a view explaining a method of detaching from the electric car the electric power conversion apparatus according to Embodiment 1 of the present invention.

As represented in FIG. 1(a), an electric power conversion apparatus 100 is attached under the car body of an electric car. As seen in FIG. 1(b), in the approximately upper half of the view illustrating the electric power conversion apparatus 100, a main circuit unit 1 including a case 1A into which a semiconductor device constituting a main circuit for converting electric power and a cooling mechanism of the semiconductor device are installed is provided. At the approximate center of the bottom face of the electric power conversion apparatus 100, a blower 2 as a cooling fan for generating wind is provided, contacting with the main circuit unit 1, for cooling by the cooling mechanism. An electrical component 3 is arranged under the main circuit unit 1 so as to surround the blower 2. Here, the electrical component 3 is an electrical part needed for configuring the electric power conversion apparatus. However, semiconductor devices mounted on cooling modules 6 and capacitors separately placed are omitted in the figure.

As seen in FIG. 1(*a*), in the side face of the main circuit unit 1, an aperture 1B (not illustrated in FIG. 1) through which the blower 2 draws outside air is provided on the case 1A, and a filter 1C is attached to the aperture 1B for preventing dust, etc. entering inside the main circuit unit 1. As illustrated in FIG. 3, ducts 4 as wind tunnels are provided in the main circuit unit 1 for flowing outside air from the aperture 1B to the blower 2. The outside air drawn from the aperture 1B provided in the side face of the electric car passes through the ducts 4 penetrating the main circuit unit 1, cools the semiconductor devices configuring the main circuit, and is exhausted by the blower 2 outside the lower portion of the electric car. The blower 2 in which a motor is placed at the center thereof is structured that rotors are provided on both sides of the motor. The rotors draw air from the motor side and exhaust it to the outside by the centrifugal force.

FIG. 2(*a*) is a perspective view of the electric power conversion apparatus 100, where the car body, the case 1A, and parts, for electrically connecting, of the electric car are omitted. A predetermined number (6 pieces, in this embodiment) of cooling modules 6, each as a cooling unit in which semiconductor devices each performing a switching operation for converting electric power are mounted, are arranged widthwise, and sets of such arranged cooling modules are provided in two rows. Capacitors 5 as a dc source for an inverter are arranged on the main circuit unit 1. Here, regarding the capacitors 5 provided on the cooling modules 6 placed in the back side of the rows, their drawing is omitted. Semiconductor devices 7 (not illustrated in FIG. 2(*b*)) are mounted on the cooling modules 6 with one-surfaces of the devices contacting the modules, and wiring boards 8 for electrically wiring each are connected to the other-surfaces of the devices. Here, the gaps between the arranged cooling modules 6 may be set narrower if electrical insulation is secured. The row of the cooling modules 6 is fixed by the case 1A or a fixing member configured of suitable material.

In FIG. 4, the cooling module 6 is configured with a device cooler 6A to which a predetermined number (three pieces, in this embodiment) of semiconductor devices 7 is mounted, a heat exchanger 6B for exchanging heat between coolant exiting the device cooler 6A and that entering there, and a radiator 6C for radiating heat from the coolant heated by the device cooler 6A. The device cooler 6A, the heat exchanger 6B, and the radiator 6C are arranged approximately on the same plane, in which the device cooler 6A is placed in the vicinity of the radiator 6C, the heat exchanger 6B is placed over the device cooler 6A. Although, in FIG. 2(*b*), the state has been illustrated in which the wiring board 8 is also attached by which the semiconductor devices 7 can constitute the electrical circuit, a state in FIG. 4 is illustrated in which the wiring board 8 is detached.

As seen in FIG. 3, the radiators 6C each are placed inside each of the ducts 4, and are cooled by wind passing through the ducts 4. Because the radiators 6C are placed in two rows, the ducts 4 are separated to two portions inside the main circuit unit 1.

The semiconductor devices mounted on a cooling module 6 should be arranged close together in an electrical circuit such as a single-phase or single-arm of a converter or inverter. As a result, the resistance and the inductance of the electrical circuit can be reduced, and the wiring can also be made easier. A single package into which a plurality of devices has been packed may be mounted on the cooling module 6. The area of the device cooler 6A and the radiator 6C of a single cooling module 6, and the number of the cooling modules 6 are determined so that all of the semiconductor devices 7 to be mounted can be mounted, an estimated amount of heat generated by the semiconductor devices 7 mounted can be dissipated from the radiator 6C, and the entire volume is as small as possible. Here, because the temperature of cooling air for the cooling module 6 placed closer to the aperture is lower and its cooling ability is higher, the amount of heat generated in the cooling module 6 may be set in such a way that the closer to the aperture the cooling module is, the larger the amount of heat is, and that the more distant to the aperture the cooling module is, the smaller the amount of heat is.

A configuration of the cooling module 6 is explained using FIG. 5. In the device cooler 6A, a plurality of heat receiving tubes 6D through which the coolant flows is arranged lengthwise with a predetermined interval, are provided at a portion where the semiconductor devices 7 represented by broken lines are mounted, and the heat receiving tubes 6D are connected at their bottom ends to a single pipe 6E, and at their top ends to the heat exchanger 6B.

In the heat exchanger 6B whose outer shape is cylindrical, two partition plates 6F whose shapes are identical are provided at respective positions a predetermined distance apart from both ends of the heat exchanger. The two partition plates 6F have a predetermined number of circular holes, each of which is connected to a cylindrical pipe 6G. The interior of the heat exchanger 6B separated by the two partition plates 6F is distinguished to the inside and the outside of the pipe 6G; that is, because the interior of the pipe 6G is connected with the outside of the partition plates 6F, the interior of the heat exchanger 6B is distinguished by two portions. The heat receiving tubes 6D arranged in the device cooler 6A are connected to the exterior of the pipes 6G in the portion sandwiched between the two partition plates 6F. The pipe 6E connected to the device cooler 6A is connected to the right-hand portion of the partition plates 6F positioned at the right side in the drawing. A pipe 6H connected to the bottom of the radiator 6C is connected to the bottom of the just right-hand portion of the partition plates 6F positioned at the left side. A pipe 6J connected to the radiator 6C is connected to the left-hand portion of the partition plates 6F positioned at the left side.

A plurality of heat radiation pipes 6K arranged lengthwise with a predetermined interval is provided in the radiator 6C, and the heat radiation pipes 6K are connected at the top thereof to the pipe 6J, and at the bottom thereof to the pipe 6H. Heat radiation fins 6L, each intervening between the heat radiation pipes 6K, are provided for increasing the heat radiation amount. The shape of the heat radiation fins 6L is determined so that cooling wind passing through the ducts 4 can be passed, pressure loss when the wind passes through the heat radiation fins 6L is within a permissible range, and the heat radiation amount is increased.

Coolant flow is also represented in FIG. 5. In the heat receiving tubes 6D included in the device cooler 6A, the coolant is heated by the heat generated in the semiconductor devices, and then starts to boil. The coolant vapor generated by the boiling is moved toward the upper heat exchanger 6B, and the liquid coolant is also moved, with being dragged by coolant-vapor bubbles, toward the heat exchanger 6B. The coolant entering the heat exchanger 6B flows outside the pipe 6G, and after the heat of the coolant is given to that in the pipe 6G, the coolant vapor is returned to liquid; thereby, the temperature of the coolant is also decreased. The coolant from the heat exchanger 6B passes through the pipe 6H, and enters the radiator 6C. The temperature of the coolant entering the radiator 6C is further decreased with the heat being given to the air. The coolant from the radiator 6C enters the heat exchanger 6B after passing through the pipe 6J. The temperature of the coolant entering the heat exchanger 6B after passing through the pipe 6J, is increased with the heat, due to the coolant passing inside the pipe 6G, being given from the external coolant. The coolant from the heat exchanger 6B passes through the pipe 6E, and returns to device cooler 6A.

The coolant boils in the heat receiving tubes 6D included in the device cooler 6A, and moves upward, and then the moved coolant vapor returns to liquid by the cooling operation; therefore, the coolant steadily flows from the boiling portion toward the portion where the vapor returns to the liquid, which results in the coolant circulating without providing a pump. Such mechanism for circulating the coolant by utilizing the coolant boiling is also referred to as a bubble pump. By utilizing the bubble pump, a pump and its fixtures, etc. are unnecessary, and the structure of the cooling module is simplified; consequently, the maintenance is facilitated.

Regarding space saving, at least a volume occupied by the pump, etc. can be reduced by utilizing the bubble pump. Moreover, in a case of the pump, etc. being provided, the gaps between the cooling modules 6 are necessary to be determined considering the height and width of the pump, etc., and therefore the gaps between the cooling modules 6 could not be reduced enough; however, the gaps between the cooling modules 6 each become possible to be held at a thickness approximately equal to that of one of the cooling modules 6 themselves, and consequently the volume needed for cooling a predetermined amount of heat generation can be set to be less than that of a case in which a pump is provided. In a case of the heat pipe being used, a volume obtained by multiplying, by the height of the heat pipe, the device-cooler area on which the heat-generating semiconductor devices are mounted was needed for the heat pipe system; on the contrary, in the present apparatus, because ensuring the radiator area corresponding to the amount of the heat generation is sufficient, and limitation is not given to the thickness of the radiator, by applying reduced thicknesses for the device cooler and the radiator, the volume needed for cooling can be reduced. The amount of the heat generation is determined corresponding to the conversion ability of the electric power conversion apparatus, and the volume needed for cooling an equivalent amount of the heat generation can be reduced. Therefore the volume of the electric power conversion apparatus whose conversion ability is equivalent to that of a conventional apparatus can be smaller than that of the conventional one.

A wiring connection method for configuring an electrical circuit of the electric power conversion apparatus is explained using FIG. 6. FIG. 6 is a perspective view, of the corner vicinity of a side to which the electrical component 3 of the main circuit unit 1 contacts, viewed from the inside of the corner, in which the cooling module 6 and the capacitor 5 are omitted. A unit-main-circuit wiring board 9 to which the wiring boards 8 connected to the semiconductor devices 7 are connected is rectangular flat plate bent into L-shape. A capacitor-main-circuit wiring board 10, whose shape is approximately similar to that of the unit-main-circuit wiring board 9, connected to the capacitors 5 is provided on the upper portion of the unit-main-circuit wiring board 9. A portion, of the capacitor-main-circuit wiring board 10, close to the corner of the side to which the electrical component 3 contacts extends towards the lower side thereof, and is connected to the unit-main-circuit wiring board 9 at the extended portion (refer to as a connecting portion 10A). A space is provided at the side of the electrical component 3 of the connecting portion 10A for performing a connecting operation and an attaching/detaching operation. Although not illustrated, the capacitor-main-circuit wiring board 10 and the electrical component 3 are also electrically connected to each other similarly to the above operation. Accordingly, the portion in which the electrical connection is performed has been arranged at the vicinity of the center; therefore, an operation such as the electrical-connection operation can be easily performed without influence of another apparatus that is adjacently arranged.

The wiring board 8, the unit-main-circuit wiring board 9, and the capacitor-main-circuit wiring board 10 are connection boards for connecting the semiconductor devices 7 and other electrical parts. Because the capacitors 5 and the main circuit unit 1 are arranged close to each other, the semiconductor devices 7 and the capacitors 5 are also arranged close to each other, whereby their electrical connection can be easily performed, the wiring length for the wiring board 8, the unit-main-circuit wiring board 9, and the capacitor-main-circuit wiring board 10 can be shortened, and consequently the resistance and the reactance or the like can be reduced.

A method of detaching the electric power conversion apparatus from the electric car is explained using FIG. 7. FIG. 7 is a cross-sectional view, orthogonal to a railway, representing a lower portion of the electric car, on the way of the main circuit unit 1 being detached, which corresponds to the Y-Y cross section in FIG. 1(b). Structural members 200 of the electric car are provided at portions close to side faces of the bottom of the electric car, and the capacitors 5 and the upper portion of the electrical component 3 are arranged in the space sandwiched between the structural members 200. After the main circuit unit 1, the capacitors 5, and the electrical component 3 have been electrically disconnected and then a fixture for fixing the main circuit unit 1 has been detached, the main circuit unit 1 is detached by being pulled to the lateral direction of the side end face of the electric car. When the blower 2, the capacitors 5, and the electrical component 3 are to be detached in a state of the main circuit unit 1 having been detached, they are detached by being pulled downward or laterally. Because the blower 2 has been attached at the center of the car, it can be easily detached downward. The electrical component 3 may directly be detached downward, or, after fixing has been released, the component is moved to the position at which the blower 2 has been attached; then, it may be detached to the downward direction or toward the side end face of the electric car. When the attaching to the electric car is performed, the operation is in inverse order to the detaching. As described above, the main circuit unit of the electric power conversion apparatus can be easily attached from and detached to the lateral direction without special tools. Because each single piece of the blower and the electrical component attached from or detached to the bottom or the side is not so large, the piece can be easily attached from and detached to the downward direction or the lateral direction. The electrical component in which an operation such as a maintenance operation is often performed is arranged at the side of the car body of the electric car; therefore, an effect is also obtained in which a work operation such as a maintenance operation of the electrical component can be performed without influence of devices that are arranged adjacent to the electric power conversion apparatus.

Because the capacitor and the main circuit unit are made separable and the capacitor is placed on the upper portion of the main circuit unit, even if the capacitor and the main circuit are arranged close to each other, and a height at which the main circuit unit can be slid out to the lateral direction is limited by any barrier, the main circuit unit can be slid out to the lateral direction with the height limitation of the main circuit unit being implemented. Because the capacitor and the main circuit are arranged close to each other, the inductance and the resistance of the main circuit can be reduced, whereby the resonance current and the accompanying loss can be reduced. By arranging the capacitor on the upper portion of the main circuit unit, the overall space-utilization efficiency can be improved and consequently, approximately 20 percent of the volume can be reduced comparing to a case in which the capacitor is placed at the side, etc. of the main circuit unit.

Because the dual-row radiators have been arranged close to each other, a single blower may be used for the dual-row parts, that is, the number of parts can be reduced and consequently, the cost can be reduced, and the reliability can be improved. Even in a case of the radiators being arranged in a single row, because the radiators are arranged side by side, an advantage is also obtained that a single blower may be used for a plurality of radiators.

Although the cooling modules have been arranged in two rows, they may be arranged in a single row or in more than two rows. The radiators of the dual-row cooling modules have been arranged close to each other, whereby the dual-row cooling modules have been configured to be cooled by the single blower, however, a blower may be provided for every row of the cooling modules or for every predetermined number of cooling modules.

Although the device cooler and the radiator of the cooling module have been laterally arranged approximately in the same plane, the device cooler and the radiator may be arranged to have a predetermined angle therebetween, may be arranged approximately in parallel to each other and in respective planes different from each other, or may be arranged one above the other or obliquely-and-laterally with each other.

Although the capacitors have been placed on the main circuit unit, they may be placed at the side, etc. of the main circuit unit. The main circuit unit has been configured to be able to be slid out to the lateral direction; however, although the operability is deteriorated, it may be configured to be attached from and detached to the downward direction.

The above description is also applicable to the other embodiments.

Embodiment 2

Figure 8:
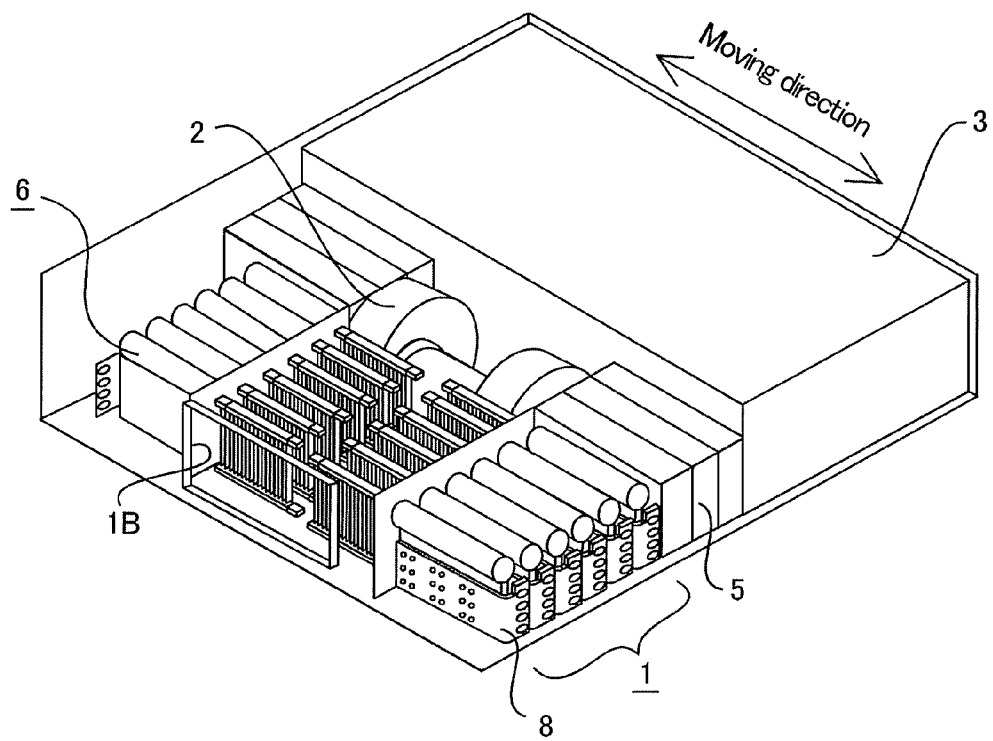
FIG. 8 is a perspective view explaining a configuration of an electric power conversion apparatus according to Embodiment 2 of the present invention.

In Embodiment 2, a case is represented in which the configuration in Embodiment 1 is changed so that the capacitors are placed at a side of the main circuit unit. FIG. 8 is a perspective view explaining a configuration of an electric power conversion apparatus according to Embodiment 2.

Only differences from those in FIG. 2 according to Embodiment 1 are explained. The capacitors 5 are placed at a side of the main circuit unit 1 and at both sides of the blower 2. The electrical component 3 is placed beyond the blower 2 and the capacitors 5 as represented in the drawing.

An effect is also obtained that the cooling modules 6 can be compacted (the volume of the cooling unit needed for cooling by a predetermined heat-generation amount can be reduced) similarly to that in Embodiment 1. The other effects are also the same as those in Embodiment 1. However, if the height of the cooling modules 6 is adjusted to the same as that in Embodiment 1, the entire area of the electric power conversion apparatus increases by that of the capacitors, which results in increase of the entire volume.

Embodiment 3

Figure 9:
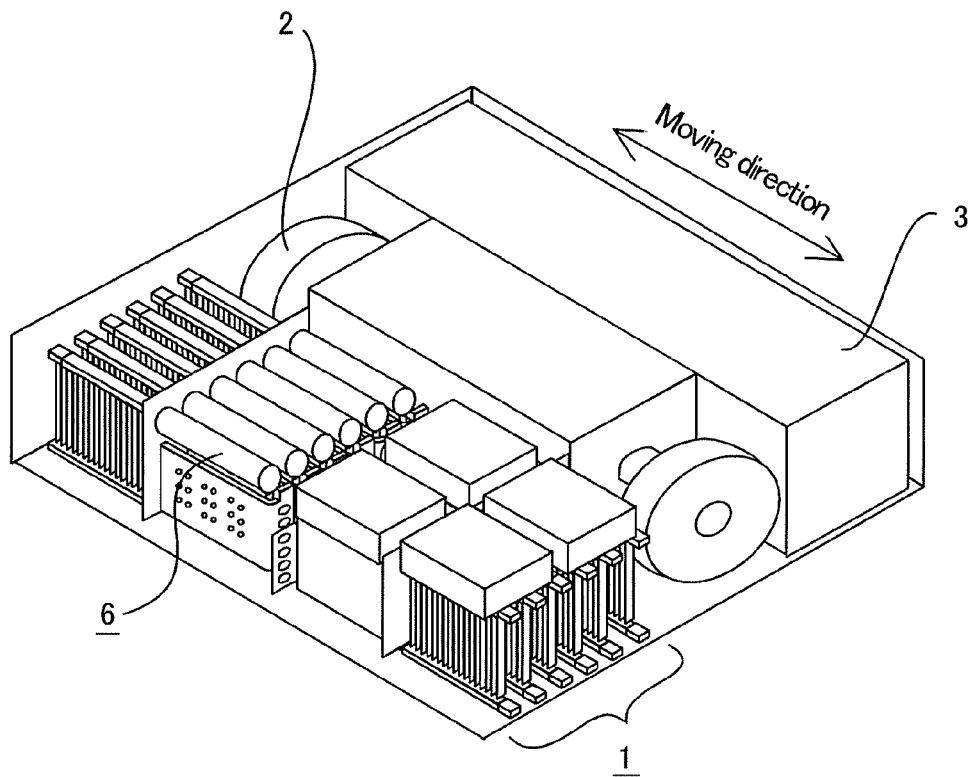
FIG. 9 is a perspective view explaining a configuration of an electric power conversion apparatus according to Embodiment 3 of the present invention.

In Embodiment 3, a case is represented in which the internal configuration of the main circuit unit and the arrangement of the blower in Embodiment 1 are changed so that the inductance of the main circuit can be reduced. FIG. 9 is a perspective view explaining a configuration of an electric power conversion apparatus according to Embodiment 3.

Only differences from those in FIG. 2 according to Embodiment 1 are explained. The dual-row cooling modules 6 are arranged so that the unit-main-circuit wiring boards 9 are close to each other, and a single blower 2 is arranged beyond each row of the arranged radiators 6C as represented in the drawing. Although the unit-main-circuit wiring board 9 and the capacitor-main-circuit wiring board 10 have been previously connected at the corner of the main circuit unit 1, they are connected in the center of the side face, facing the electrical component 3, of the main circuit unit 1, not illustrated in the figure.

An effect is also obtained that the cooling modules 6 can be compacted similarly to that in Embodiment 1. Moreover, because the two unit-main-circuit wiring boards 9 are close to each other, the inductance and the resistance of the main circuit can be reduced more than those in Embodiment 1, whereby an effect is also obtained that the loss can be reduced because of the resonance current being suppressed.

Embodiment 4

Figure 10:
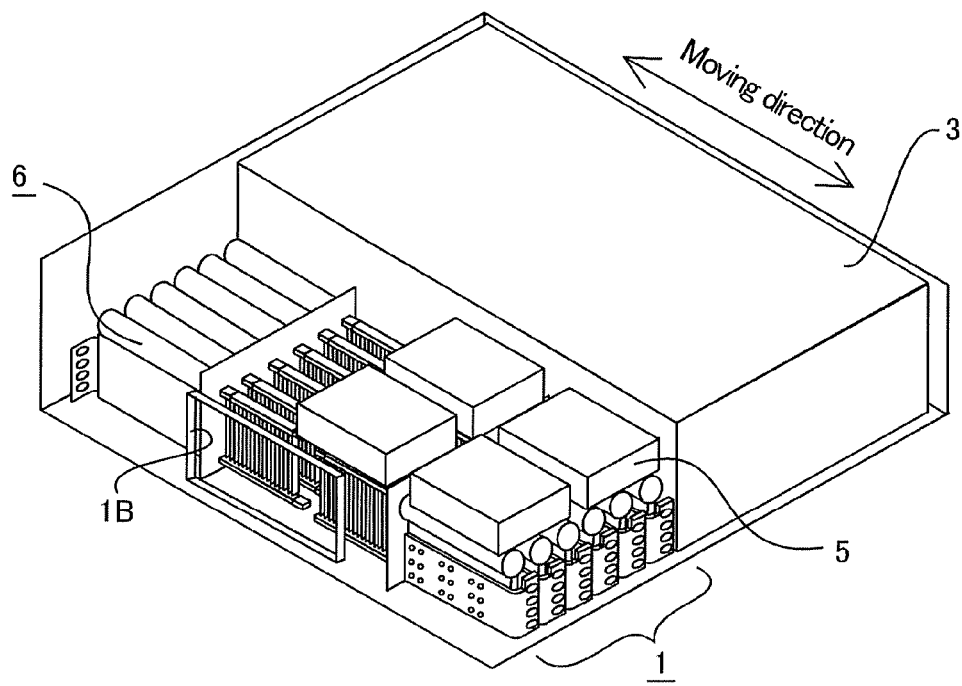
FIG. 10 is a perspective view explaining a configuration of an electric power conversion apparatus according to Embodiment 4 of the present invention.
Figure 11:
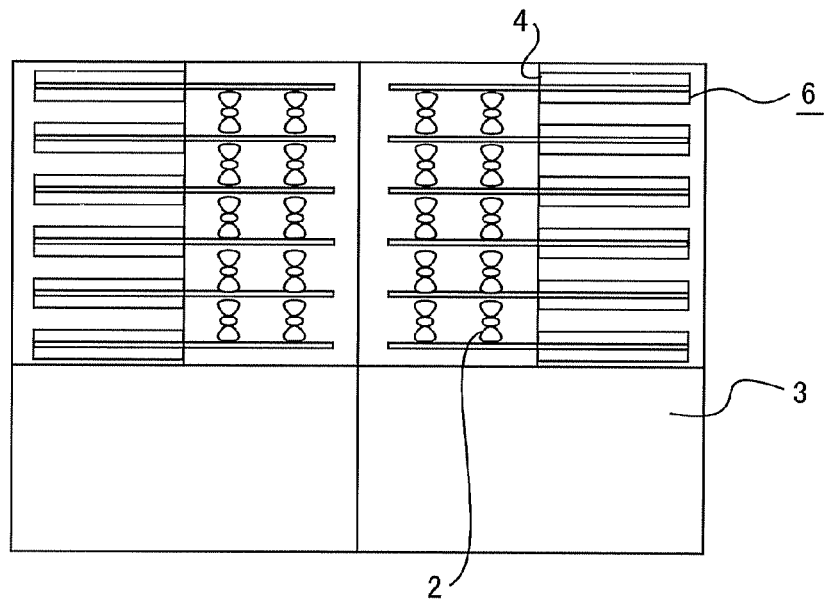
FIG. 11 is a plan view explaining the configuration of the electric power conversion apparatus according to Embodiment 4 of the present invention, viewed from the bottom of the apparatus.

In Embodiment 4, a case is represented in which the configuration in Embodiment 1 is changed, by providing a blower for every predetermined number of cooling modules, so that the modularity of the cooling module is further improved. FIG. 10 is a perspective view explaining a configuration of an electric power conversion apparatus according to Embodiment 4. FIG. 11 is a plan view of the main circuit unit 1 viewed from the bottom.

Only differences from those in FIG. 2 according to Embodiment 1 are explained. Because the blowers 2 are arranged under the cooling module 1, they cannot be viewed in the perspective view. As seen from FIG. 11 as the plan view viewed from the bottom, two blowers 2 are arranged for every two cooling modules 1.

An effect is also obtained that the cooling modules 6 can be compacted similarly to that in Embodiment 1. Moreover, because the blower is provided for every predetermined number of cooling modules, an effect is also obtained that the modularity according to the set of the blower and the predetermined number of cooling modules is further improved.

Embodiment 5

Figure 12:
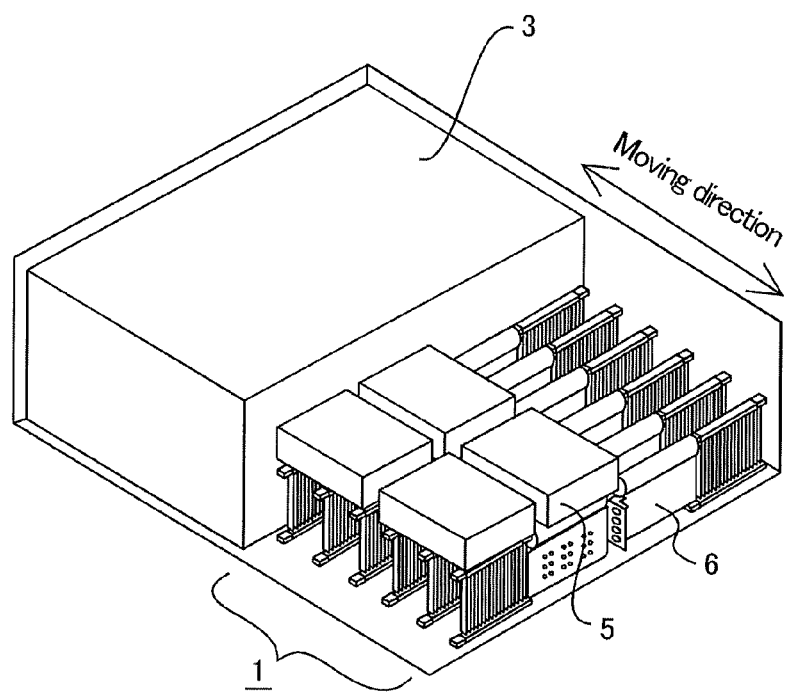
FIG. 12 is a perspective view explaining a configuration of an electric power conversion apparatus according to Embodiment 5 of the present invention.
Figure 13:
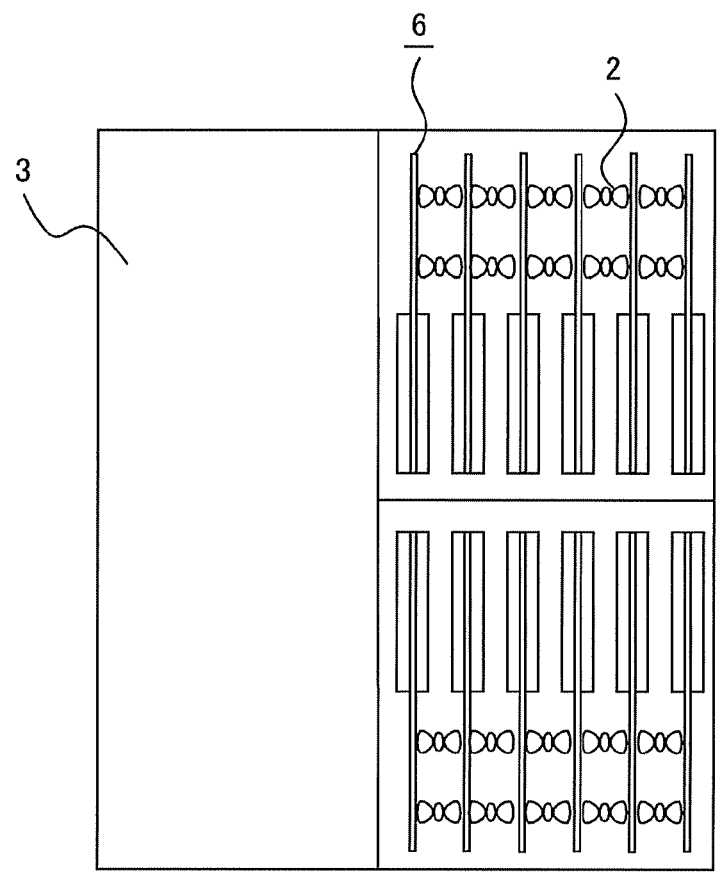
FIG. 13 is a plan view explaining the configuration of the electric power conversion apparatus according to Embodiment 5 of the present invention, viewed from the bottom of the apparatus.
Figure 14:
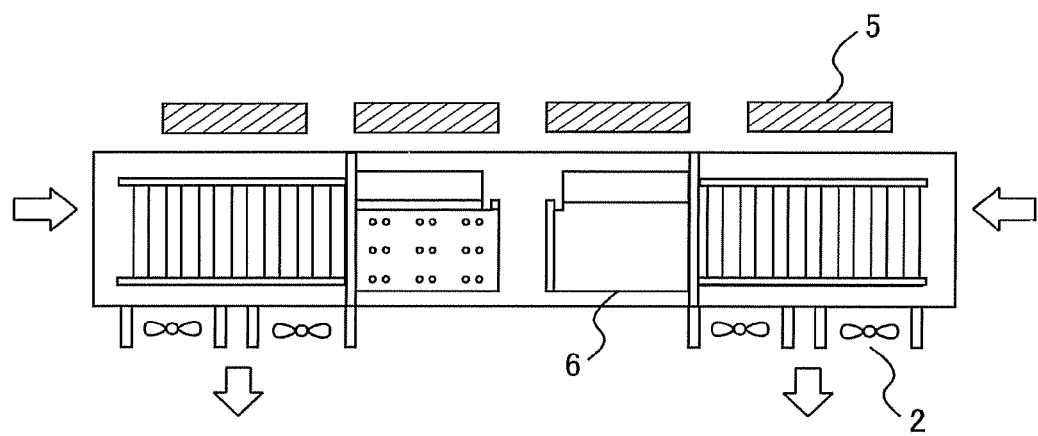
FIG. 14 is a cross-sectional view explaining the configuration of the electric power conversion apparatus according to Embodiment 5 of the present invention.

In Embodiment 5, a case is represented in which the configuration in Embodiment 4 is changed so that outside air is introduced through the both side faces of the electric car. FIG. 12 is a perspective view explaining a configuration of an electric power conversion apparatus according to Embodiment 5. FIG. 13 is a plan view of the main circuit unit 1 viewed from the bottom. FIG. 14 is a cross-sectional view explaining wind flow inside the main circuit unit 1.

Only differences from those in FIG. 10 and FIG. 11 according to Embodiment 4 are explained. The main circuit unit 1 is arranged perpendicular to the moving direction of the electric car, so that the radiators 6C of the cooling modules 6 positions on a side face of the electric car. The blower 2 operates to draw outside air through the both side faces of the electric car, and then to exhaust it to the downward direction of the electric power conversion apparatus.

An effect is also obtained that the cooling modules 6 can be compacted similarly to that in Embodiment 1. Moreover, because the blower is provided for every predetermined number of cooling modules, an effect is also obtained that the modularity according to the set of the blower and the predetermined number of cooling modules is further improved. Furthermore, because outside air can be introduced through the both side faces of the electric car, a larger amount of outside air can be drawn, which results in effect of an improved cooling efficiency.

What is claimed is:

1. An electric power conversion apparatus for an electric car comprising:
    semiconductor devices each performing a switching operation for electric power conversion;
    a bubble-pump type cooling unit including a device cooler in contact with the semiconductor devices, having a plurality of heat receiving tubes wherein coolant vertically flows therein, said plurality of heat receiving tubes being arranged in a row whose direction is parallel to a side face of the electric car, a radiator into which the coolant heated in the device cooler flows for radiating the heat from the coolant, and a heat exchanger for exchanging heat between a coolant entering the device cooler after exiting from the radiator and a coolant entering the radiator after exiting from the device cooler; and
    a cooling fan configured to generate wind for blowing through the radiator.

2. An electric power conversion apparatus for an electric car as recited in claim 1, wherein the cooling unit includes a plurality of cooling units, each cooling unit from the plurality arranged side by side, and their radiators are arranged side by side adjacent to each other.

3. An electric power conversion apparatus for an electric car as recited in claim 2, wherein the cooling fan is provided for every predetermined number of cooling units.

4. An electric power conversion apparatus for an electric car as recited in claim 2, further comprising a fixing member for fixing the plurality of cooling units.

5. An electric power conversion apparatus for an electric car as recited in claim 4, further comprising a capacitor for storing DC electric power, wherein the capacitor and the plurality of cooling units fixed by the fixing member are arranged one above the other.

6. An electric power conversion apparatus for an electric car as recited in claim 4, wherein the plurality of cooling units fixed by the fixing member is attached to an outer side of a bottom of an electric car body from a lateral direction thereof.

7. An electric power conversion apparatus for an electric car as recited in claim 4, further comprising connection boards for connecting the semiconductor devices with other electrical parts, wherein the cooling units are arranged in a plurality of rows so that the connection boards come close to each other.

8. An electric power conversion apparatus for an electric car as recited in claim 4, further comprising a capacitor for storing DC electric power, and connection boards for connecting the semiconductor devices with other electrical parts, wherein the semiconductor devices and the capacitor are arranged close to each other.

9. An electric power conversion apparatus for an electric car as recited in claim 4, further comprising connection boards for connecting the semiconductor devices with other electrical parts, wherein a portion to which the connection boards are connected is provided in the center of the apparatus.

10. An electric power conversion apparatus for an electric car as recited in claim 1, further comprising a wind tunnel for allowing wind generated by the cooling fan to pass therethrough, wherein the radiator is arranged in the wind tunnel.

11. An electric power conversion apparatus for an electric car as recited in claim 1, wherein the cooling fan and an electrical component are placed in the center and on the periphery of the apparatus, respectively.

12. An electric power conversion apparatus for an electric car as recited in claim 1, wherein the radiator is arranged, parallel to the side face of the electric car, adjacent to the device cooler.

13. An electric power conversion apparatus for an electric car as recited in claim 1, wherein the cooling fan operates to draw outside air from a side face of the electric car, and exhaust to a downside thereof.

14. An electric power conversion apparatus for an electric car as recited in claim 1, wherein the device cooler, including the plurality of heat receiving tubes, is connected, at a top end thereof, to the heat exchanger, is configured to form a plane to which the semiconductor devices are mounted, the cooling unit further comprising a pipe, to which the heat receiving tubes are connected at their bottom ends, for the flow of coolant from the heat exchanger to the heat receiving tubes.

15. An electric power conversion apparatus for an electric car as recited in claim 14, wherein the cooling fan is provided for every predetermined number of cooling units.

16. An electric power conversion apparatus for an electric car as recited in claim 14, further comprising a fixing member for fixing the plurality of cooling units.

17. An electric power conversion apparatus for an electric car as recited in claim 14, wherein the device cooler, the heat exchanger, and the radiator are arranged approximately on the same plane.

18. An electric power conversion apparatus for an electric car comprising:
    semiconductor devices each performing a switching operation for electric power conversion;
    a bubble-pump type cooling unit including a device cooler in contact with the semiconductor devices, having a plurality of heat receiving tubes wherein coolant vertically flows therein, said plurality of heat receiving tubes being arranged in a row whose direction is parallel to a principle direction of movement of the electric car along a railway, a radiator into which the coolant heated in the device cooler flows for radiating the heat from the coolant, and a heat exchanger for exchanging heat between a coolant entering the device cooler after exiting from the radiator and a coolant entering the radiator after exiting from the device cooler; and
    a cooling fan configured to generate wind for blowing through the radiator.

* * * * *